(12) United States Patent
Zheng

(10) Patent No.: US 11,581,051 B2
(45) Date of Patent: Feb. 14, 2023

(54) SHIFT REGISTER AND DRIVING METHOD THEREOF, GATE DRIVE CIRCUIT, AND DISPLAY DEVICE

(71) Applicant: BOE TECHNOLOGY GROUP CO., LTD., Beijing (CN)

(72) Inventor: Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 443 days.

(21) Appl. No.: 16/613,125

(22) PCT Filed: May 21, 2019

(86) PCT No.: PCT/CN2019/087835
§ 371 (c)(1),
(2) Date: Nov. 13, 2019

(87) PCT Pub. No.: WO2020/001200
PCT Pub. Date: Jan. 2, 2020

(65) Prior Publication Data
US 2021/0358367 A1    Nov. 18, 2021

(30) Foreign Application Priority Data
Jun. 28, 2018 (CN) .......................... 201810691092.0

(51) Int. Cl.
*G11C 19/28* (2006.01)
*G09G 3/20* (2006.01)

(52) U.S. Cl.
CPC ............. *G11C 19/28* (2013.01); *G09G 3/20* (2013.01); *G09G 2300/0426* (2013.01);
(Continued)

(58) Field of Classification Search
CPC .... G09G 3/20; G09G 3/3266; G09G 2300/04; G09G 2310/0267; G09G 2310/0286;
(Continued)

(56) References Cited

U.S. PATENT DOCUMENTS

2012/0038609 A1* 2/2012 Chung ................. G09G 3/3266
345/211
2015/0116194 A1* 4/2015 Matsui ................... G11C 19/28
345/100

(Continued)

FOREIGN PATENT DOCUMENTS

CN   204257215 U    4/2015
CN   104883181 A    9/2015
(Continued)

OTHER PUBLICATIONS

Office action issued in Chinese Application No. 201810691092.0, dated Jul. 24, 2020, 20 pages.

*Primary Examiner* — Amr A Awad
*Assistant Examiner* — Aaron Midkiff
(74) *Attorney, Agent, or Firm* — Dave Law Group LLC; Raj S. Dave

(57) ABSTRACT

A shift register and a driving method thereof, a gate drive circuit, and a display device are provided. The shift register includes: an input circuit, configured to input an input voltage provided by the input voltage terminal to an intermediate circuit under control of a first clock signal provided by the first clock signal terminal; the intermediate circuit, configured to write a second clock signal output by the second clock signal terminal or a first power signal output by the first power terminal to the intermediate output terminal as an intermediate output signal under control of the input voltage and the control circuit; and an output circuit, con-
(Continued)

figured to output an output signal, a phase of which is opposite to a phase of the intermediate output signal.

16 Claims, 5 Drawing Sheets

(52) U.S. Cl.
CPC ............... *G09G 2310/0267* (2013.01); *G09G 2310/0286* (2013.01); *G09G 2330/02* (2013.01)

(58) Field of Classification Search
CPC ....... G09G 2330/02; G09G 2300/0426; G09G 2310/0283; G09G 2310/0289; G09G 5/00–42; G09G 3/3276; G11C 19/28–287
USPC ........................................ 345/100; 377/64–81
See application file for complete search history.

(56) References Cited

U.S. PATENT DOCUMENTS

| | | | |
|---|---|---|---|
| 2016/0329015 A1* | 11/2016 | Ji | G11B 19/28 |
| 2017/0004775 A1* | 1/2017 | Chen | G09G 3/3233 |
| 2017/0141777 A1 | 5/2017 | Wu | |
| 2018/0068635 A1 | 3/2018 | Zhu | |
| 2019/0068196 A1 | 2/2019 | Feng et al. | |

FOREIGN PATENT DOCUMENTS

| | | |
|---|---|---|
| CN | 105243984 A | 1/2016 |
| CN | 107103870 A | 8/2017 |
| CN | 107301834 A | 10/2017 |
| CN | 107863057 A | 3/2018 |

\* cited by examiner

SHIFT REGISTER AND DRIVING METHOD THEREOF, GATE DRIVE CIRCUIT, AND DISPLAY DEVICE

CROSS-REFERENCE

The present application is the U.S. national stage of International Patent Application No. PCT/CN2019/087835, filed on May 21, 2019, which claims priority to Chinese patent application No. 201810307536.6, filed on Apr. 8, 2018, the entire disclosures of which are incorporated herein by reference as part of the present application.

TECHNICAL FIELD

The embodiments of the present disclosure relate to a shift register and a driving method thereof, a gate drive circuit, and a display device.

BACKGROUND

With rapid development of display technologies, display panels are developing increasingly towards high integration and low cost. A gate-driver on array (GOA) technology is a method in which a gate drive circuit is directly integrated on an array substrate of a display device by a photolithography process. A GOA circuit typically comprises a plurality of cascaded shift registers, each shift register corresponds to a gate line corresponding to a row of pixels (for example, each shift register provides a scan driving signal to a gate line connected pixels in one row), so as to implement scan driving of the display panel. The GOA technology can save a bonding area of a gate integrated circuit (IC) and a space of the fan-out area, thereby achieving a narrow frame of the display panel, and reducing the product cost and improving the product yield at the same time.

SUMMARY

At least one embodiment of the present disclosure provides a shift register, the shift register comprises: an input circuit, a control circuit, an intermediate circuit, and an output circuit, the input circuit is electrically connected to an input voltage terminal and a first clock signal terminal, respectively, and is configured to input an input voltage provided by the input voltage terminal to the intermediate circuit under control of a first clock signal provided by the first clock signal terminal; the intermediate circuit is electrically connected to an intermediate output terminal, a first power terminal, a second power terminal, the first clock signal terminal, and a second clock signal terminal, respectively, and is configured to, under control of the input voltage and the control circuit, write a second clock signal output by the second clock signal terminal or a first power signal output by the first power terminal to the intermediate output terminal as an intermediate output signal; and the output circuit is electrically connected to the first power terminal, the second power terminal, a third power terminal, a third clock signal terminal, the intermediate output terminal, and an output terminal, respectively, and is configured to output an output signal, a phase of which is opposite to a phase of the intermediate output signal, at the output terminal.

For example, in the shift register provided by an embodiment of the present disclosure, the output circuit comprises a first output sub-circuit, a second output sub-circuit, and a first storage circuit, the first output sub-circuit is electrically connected to the first power terminal, the intermediate output terminal, the output terminal, and a first node, respectively, and is configured to: in an output phase, write the first power signal to the output terminal under control of the intermediate output signal; the second output sub-circuit is electrically connected to the second power terminal, the third power terminal, the third clock signal terminal, the first node, and the output terminal, respectively, and is configured to: in an input phase, a buffer phase, and a stabilization phase, write a second power signal provided by the second power terminal to the output terminal under control of a third clock signal output by the third clock signal terminal; and the first storage circuit is electrically connected to the first node and the output terminal.

For example, in the shift register provided by an embodiment of the present disclosure, the first output sub-circuit comprises a first transistor and a second transistor, a first electrode of the first transistor is electrically connected to the first power terminal, a second electrode of the first transistor is electrically connected to the first node, and a gate electrode of the first transistor is electrically connected to the intermediate output terminal; a first electrode of the second transistor is electrically connected to the first power terminal, a second electrode of the second transistor is electrically connected to the output terminal, and a gate electrode of the second transistor is electrically connected to the intermediate output terminal; the second output sub-circuit comprises a third transistor and a fourth transistor, a first electrode of the third transistor is electrically connected to the first node, a second electrode of the third transistor is electrically connected to the third power terminal, and a gate electrode of the third transistor is electrically connected to the third clock signal terminal; a first electrode of the fourth transistor is electrically connected to the output terminal, a second electrode of the fourth transistor is electrically connected to the second power terminal, and a gate electrode of the fourth transistor is electrically connected to the first node; and the first storage circuit comprises a first capacitor, a first terminal of the first capacitor is electrically connected to the first node, and a second terminal of the first capacitor is electrically connected to the output terminal.

For example, in the shift register provided by an embodiment of the present disclosure, the third power terminal is configured to provide a third power signal, and the second power signal is larger than the third power signal.

For example, in the shift register provided by an embodiment of the present disclosure, a relationship between the second power signal and the third power signal is expressed as: $VL-VL1>|Vth10+Vth12|$, where VL represents the second power signal, VL1 represents the third power signal, Vth10 represents a threshold voltage of the third transistor, and Vth12 represents a threshold voltage of the fourth transistor.

For example, in the shift register provided by an embodiment of the present disclosure, the intermediate circuit is configured to: in the input phase, write the second clock signal to the intermediate output terminal as the intermediate output signal under control of the input voltage; in the output phase and the buffer phase, write the second clock signal to the intermediate output terminal as the intermediate output signal; and in the stabilization phase, write the first power signal to the intermediate output terminal as the intermediate output signal under control of the control circuit.

For example, in the shift register provided by an embodiment of the present disclosure, the intermediate circuit comprises: a first control sub-circuit, electrically connected to a second node, a third node, a fourth node, the first power terminal, the second power terminal, and the second clock signal terminal, respectively, and configured to: in the input phase, write the input voltage to the second node; and in the stabilization phase, write the first power signal to the second node; a second control sub-circuit, electrically connected to the third node, the fourth node, and the first clock signal terminal, respectively, and configured to write the first clock signal to the third node; and an intermediate output sub-circuit, electrically connected to the second node, the intermediate output terminal, and the second clock signal terminal, respectively, and configured to: in the input phase, the output phase, and the buffer phase, write the second clock signal to the intermediate output terminal as the intermediate output signal.

For example, in the shift register provided by an embodiment of the present disclosure, the first control sub-circuit comprises a fifth transistor, a sixth transistor, and a seventh transistor, a first electrode of the fifth transistor is electrically connected to the first power terminal, a second electrode of the fifth transistor is electrically connected to a first electrode of the sixth transistor, and a gate electrode of the fifth transistor is electrically connected to the third node; a second electrode of the sixth transistor is electrically connected to the fourth node, and a gate electrode of the sixth transistor is electrically connected to the second clock signal terminal; and a first electrode of the seventh transistor is electrically connected to the fourth node, a second electrode of the seventh transistor is electrically connected to the second node, and a gate electrode of the seventh transistor is electrically connected to the second power terminal.

For example, in the shift register provided by an embodiment of the present disclosure, the second control sub-circuit comprises an eighth transistor, a first electrode of the eighth transistor is electrically connected to the third node, a second electrode of the eighth transistor is electrically connected to the first clock signal terminal, and a gate electrode of the eighth transistor is electrically connected to the fourth node.

For example, in the shift register provided by an embodiment of the present disclosure, the intermediate output sub-circuit comprises a ninth transistor, a first electrode of the ninth transistor is electrically connected to the second clock signal terminal, a second electrode of the ninth transistor is electrically connected to the intermediate output terminal, and a gate electrode of the ninth transistor is electrically connected to the second node.

For example, in the shift register provided by an embodiment of the present disclosure, the intermediate circuit further comprises a second storage sub-circuit, the second storage sub-circuit comprises a second capacitor, a first terminal of the second capacitor is electrically connected to the second node, and a second terminal of the second capacitor is electrically connected to the intermediate output terminal.

For example, in the shift register provided by an embodiment of the present disclosure, the intermediate circuit further comprises: an intermediate output control sub-circuit, electrically connected to the third node, the intermediate output terminal, and the first power terminal, respectively, and configured to: in the stabilization phase, write the first power signal to the intermediate output terminal under control of the control circuit; and a third storage sub-circuit, electrically connected to the third node and the first power terminal, respectively.

For example, in the shift register provided by an embodiment of the present disclosure, the intermediate output control sub-circuit comprises a tenth transistor, and the third storage sub-circuit comprises a third capacitor, a first electrode of the tenth transistor is electrically connected to the first power terminal, a second electrode of the tenth transistor is electrically connected to the intermediate output terminal, and a gate electrode of the tenth transistor is electrically connected to the third node; a first terminal of the third capacitor is electrically connected to the third node, and a second terminal of the third capacitor is electrically connected to the first power terminal.

For example, in the shift register provided by an embodiment of the present disclosure, a high level of the second clock signal is identical to a level of the first power signal, and a low level of the second clock signal is identical to a level of the second power signal.

For example, in the shift register provided by an embodiment of the present disclosure, the control circuit comprises an eleventh transistor, a first electrode of the eleventh transistor is electrically connected to the second power terminal, a second electrode of the eleventh transistor is electrically connected to the third node, and a gate electrode of the eleventh transistor is electrically connected to the first clock signal terminal.

For example, in the shift register provided by an embodiment of the present disclosure, a high level of a clock signal output by the third clock signal terminal is identical to a level of the first power signal, and a low level of the clock signal output by the third clock signal terminal is identical to a level of the third power signal.

For example, in the shift register provided by an embodiment of the present disclosure, the input circuit comprises a twelfth transistor, a first electrode of the twelfth transistor is electrically connected to the input voltage terminal, a second electrode of the twelfth transistor is electrically connected to a fourth node, and a gate electrode of the twelfth transistor is electrically connected to the first clock signal terminal.

At least one embodiment of the present disclosure also provides a gate drive circuit, comprising the shift register according to any one of the above embodiments.

For example, the gate drive circuit provided by an embodiment of the present disclosure comprises a plurality of cascaded shift registers according to any one of the above embodiments, in addition to a first-stage shift register, an input voltage terminal of a current-stage shift register is electrically connected to an intermediate output terminal of a previous-stage shift register.

For example, the gate drive circuit provided by an embodiment of the present disclosure also comprises a signal generation circuit, the signal generation circuit is configured to generate a first control signal, a second control signal, a third control signal, and a fourth control signal, the first control signal is applied to a first clock signal terminal of a (2N−1)-th-stage shift register and a second clock signal terminal of a 2N-th-stage shift register; the second control signal is applied to a second clock signal terminal of the (2N−1)-th-stage shift register and a first clock signal terminal of the 2N-th-stage shift register; the third control signal is applied to a third clock signal terminal of the (2N−1)-th-stage shift register; the fourth control signal is applied to a third clock signal terminal of the 2N-th-stage shift register; N is an positive integer, and N is greater than or equal to 1.

At least one embodiment of the present disclosure also provides a display device, comprising the gate drive circuit according to any one of the above embodiments.

At least one embodiment of the present disclosure also provides a driving method of a shift register, comprising: under control of the input voltage and the control circuit, writing the second clock signal output by the second clock signal terminal or the first power signal output by the first power terminal to the intermediate output terminal as the intermediate output signal; and under control of the intermediate output signal and a third clock signal output by the third clock signal terminal, outputting the output signal, the phase of which is opposite to the phase of the intermediate output signal, at the output terminal.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
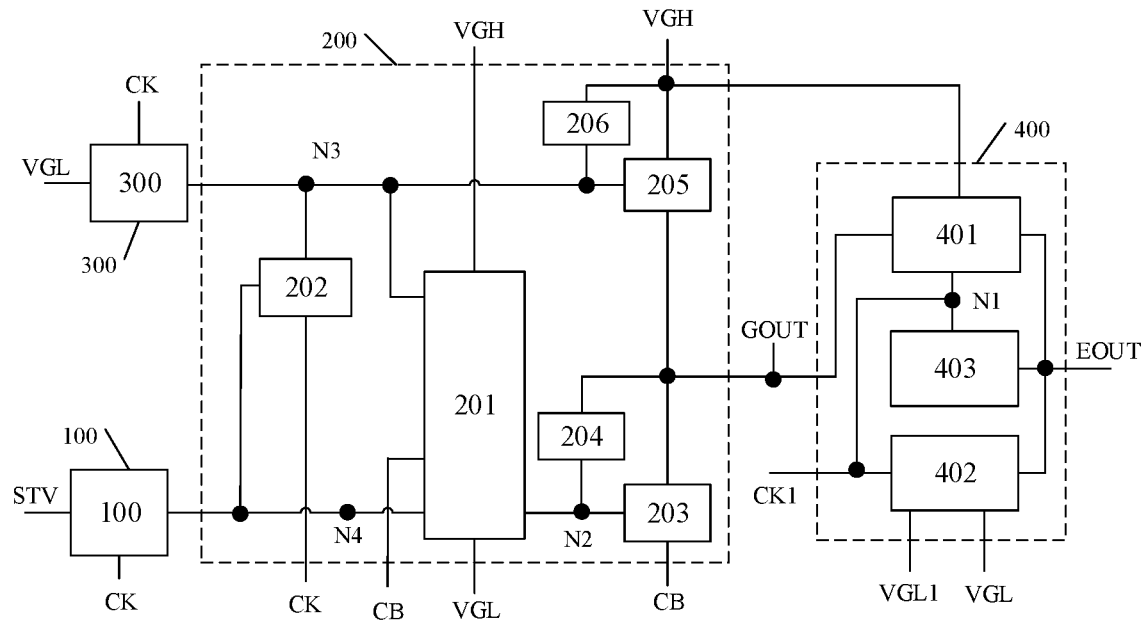
FIG. 1 is a schematic block diagram of a shift register provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to make the following description of the embodiments of the present disclosure clear and concise, the present disclosure omits detailed description of known functions and known components.

Currently, in an organic light emitting diode display panel (OLED) and a liquid crystal display panel (LCD), transistors in a shift register of a gate drive circuit are P-type thin film transistors, in a case where the gate drive circuit (for example, a GOA circuit) needs to output a high pulse signal, the high pulse signal output by the GOA circuit is inaccurate due to the threshold loss of a low-level signal output by a P-type thin film transistor, thereby affecting the display effect and reducing the display quality. Therefore, how to design a GOA circuit with a simple structure and including a P-type thin film transistor outputting a low-level signal without threshold loss has become an urgent problem to be solved.

At least one embodiment of the present disclosure provides a shift register and a gate drive circuit, the shift register can add a third power terminal to output a DC power signal, thereby achieving that a P-type thin film transistor outputs a low-level signal without threshold loss, and improving the display quality of the display panel; and on the other hand, the shift register has a simple structure, and a production cost of the shift register is low.

Some embodiments of the present disclosure are described in detail below with reference to the accompanying drawings, however the present disclosure is not limited to these specific embodiments.

Figure 2:
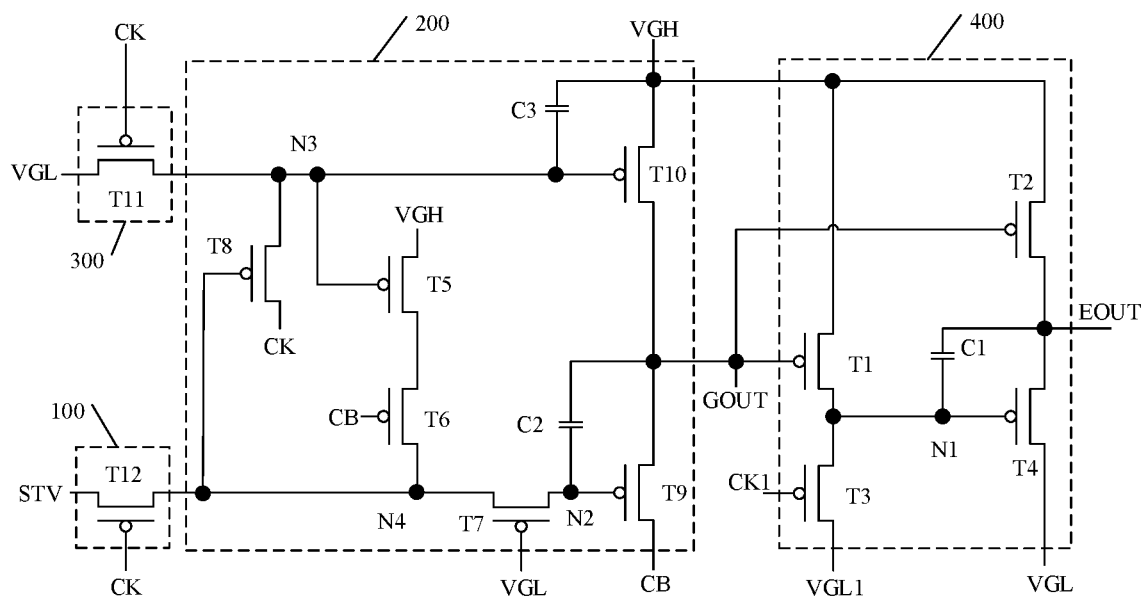
FIG. 2 is a schematic diagram of a circuit structure of a specific implementation example of a shift register provided by some embodiments of the present disclosure.

FIG. 1 is a schematic block diagram of a shift register provided by some embodiments of the present disclosure, FIG. 2 is a schematic diagram of a circuit structure of a specific implementation example of a shift register provided by some embodiments of the present disclosure.

An embodiment of the present disclosure provides a shift register. For example, as shown in FIG. 1, the shift register comprises an input circuit 100, an intermediate circuit 200, a control circuit 300, and an output circuit 400.

For example, as shown in FIG. 1, the input circuit 100 is electrically connected to an input voltage terminal STV and a first clock signal terminal CK, respectively, and the input circuit 100 is also electrically connected to the intermediate circuit 200. The input voltage terminal STV is configured to provide an input voltage $V_{in}$, and the first clock signal terminal CK is configured to provide a first clock signal $V_{c1}$. The input circuit 100 is configured to input the input voltage $V_{in}$ provided by the input voltage terminal STV to the intermediate circuit 200 under control of the first clock signal $V_{c1}$ provided by the first clock signal terminal CK. That is, in a case where the input circuit 100 is turned on under control of the first clock signal $V_{c1}$, the input voltage terminal STV is connected to the intermediate circuit 200, and the input voltage $V_{in}$ can be transmitted to the intermediate circuit 200.

For example, as shown in FIG. 1, the intermediate circuit 200 is electrically connected to an intermediate output terminal GOUT, a first power terminal VGH, a second power terminal VGL, the first clock signal terminal CK, and a second clock signal terminal CB, respectively. The first power terminal VGH is configured to provide a first power signal VH, the second power terminal VGL is configured to provide a second power signal VL, and the second clock signal terminal CB is configured to output a second clock signal $V_{c2}$. The intermediate circuit 200 is configured to, under control of the input voltage $V_{in}$ and the control circuit 300, write the second clock signal $V_{c2}$ output by the second clock signal terminal CB or the first power signal VH output by the first power terminal VGH to the intermediate output terminal GOUT as an intermediate output signal $V_{GOUT}$. That is, under control of the input voltage $V_{in}$ and the control circuit 300, in a case where the intermediate circuit 200 connects the second clock signal terminal CB with the intermediate output terminal GOUT, the second clock signal $V_{c2}$ can be written to the intermediate output terminal GOUT as the intermediate output signal $V_{GOUT}$; or in a case where the intermediate circuit 200 connects the first power terminal VGH with the intermediate output terminal GOUT, the first power signal VH can be written to the intermediate output terminal GOUT as the intermediate output signal $V_{GOUT}$.

For example, as shown in FIG. 1, the control circuit 300 is electrically connected to the second power terminal VGL, the first clock signal terminal CK, and the intermediate circuit 200, respectively. The control circuit 300 is configured to output the second power signal VL output by the second power terminal VGL to the intermediate circuit 200 under control of the first clock signal $V_{c1}$ provided by the first clock signal terminal CK. That is, in a case where the control circuit 300 is turned on under control of the first clock signal $V_{c1}$, the second power terminal VGL is connected to the intermediate circuit 200, such that the second power signal VL can be transmitted to the intermediate circuit 200.

For example, as shown in FIG. 1, the output circuit 400 is electrically connected to the first power terminal VGH, the second power terminal VGL, a third power terminal VGL1, a third clock signal terminal CK1, the intermediate output terminal GOUT, and an output terminal EOUT, respectively. The third power terminal VGL1 is configured to provide a third power signal VL1, and the third clock signal terminal CK1 is configured to provide a third clock signal $V_{c3}$. The output circuit 400 is configured to output an output signal $V_{EOUT}$, a phase of which is opposite to a phase of the intermediate output signal $V_{GOUT}$. For example, under control of the intermediate output signal $V_{GOUT}$ and the third clock signal $V_{c3}$, in a case where one terminal, of the output circuit 400, connected to the first power terminal VGH and one terminal, of the output circuit 400, connected to the output terminal EOUT are electrically connected to each other, the output circuit 400 transmits the first power signal VH to the output terminal EOUT as a high-level signal of the output signal $V_{EOUT}$; and in a case where one terminal, of the output circuit 400, connected to the second power terminal VGL and one terminal, of the output circuit 400, connected to the output terminal EOUT are electrically connected to each other, the output circuit 400 transmits the second power signal VL to the output terminal EOUT as a low-level signal of the output signal $V_{EOUT}$.

For example, the second power signal VL is larger than the third power signal VL1, so that the threshold loss of the second power signal VL output to the output terminal EOUT via an output transistor (for example, a fourth transistor T4 as shown in FIG. 2) can be reduced.

For example, the first power signal VH, the second power signal VL, and the third power signal VL1 are all DC signals. The first power signal VH is a high-level signal (for example, 5V, 10V, or other voltage); the second power signal VL is a low-level signal (for example, 0V, -1V, or other voltage); the third power signal VL1 is also a low-level signal (for example, -1V, -2V, or other voltage). It should be noted that the low-level signal and the high-level signal are relative, and the low-level signal is smaller than the high-level signal. In various different embodiments, values of the high-level signal may be different, and values of the low-level signal may also be different, provided that the second power signal VL is greater than the third power signal VL1, and the embodiments of the present disclosure do not limit this case.

It should be noted that transistors used in the embodiment of the present disclosure may be thin film transistors, field effect transistors, or other switching devices with the similar characteristics. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode, and therefore the first electrode and the second electrode of all or part of the transistors in the embodiments of the present disclosure are interchangeable as required. For example, the first electrode of the transistor described in the embodiment of the present disclosure may be the source electrode, and the second electrode may be the drain electrode; alternatively, the first electrode of the transistor may be the drain electrode, and the second electrode may be the source electrode. In addition, the transistors may be classified into N-type transistors and P-type transistors according to the characteristics of the transistors. In a case where the transistor is a P-type transistor, a turn-on voltage is a low level voltage (such as, 0V, -5V, or other value), and a turn-off voltage is a high level voltage (such as, 5V, 10V, or other value); and in a case where the transistor is an N-type transistor, a turn-on voltage is a high level voltage (such as, 5V, 10V, or other value), and a turn-off voltage is a low level voltage (such as, 0V, -5V, or other value).

For example, in some embodiments of the present disclosure, all transistors are P-type transistors.

For example, as shown in FIG. 1, the output circuit 400 may comprise a first output sub-circuit 401, a second output sub-circuit 402, and a first storage circuit 403.

For example, the first output sub-circuit 401 is electrically connected to the first power terminal VGH, the intermediate output terminal GOUT, the output terminal EOUT, and a first node N1, respectively, and the first output sub-circuit 401 is configured to: in an output phase, write the first power signal VH to the output terminal EOUT as a high-level signal of the output signal $V_{EOUT}$ under control of the intermediate output signal $V_{GOUT}$.

For example, the second output sub-circuit 402 is electrically connected to the second power terminal VGL, the third power terminal VGL1, the third clock signal terminal CK1, the first node N1, and the output terminal EOUT, respectively, and the second output sub-circuit 402 is configured to: in an input phase, a buffer phase, and a stabilization phase, write the second power signal VL provided by the second power terminal VGL to the output terminal EOUT as a low-level signal of the output signal $V_{EOUT}$ under control of the third clock signal $V_{c3}$ output by the third clock signal terminal CK1.

For example, the first storage circuit 403 is electrically connected to the first node N1 and the output terminal EOUT, respectively.

For example, as shown in FIG. 2, the first output sub-circuit 401 comprises a first transistor T1 and a second transistor T2. A first electrode of the first transistor T1 is electrically connected to the first power terminal VGH to receive the first power signal VH, a second electrode of the first transistor T1 is electrically connected to the first node N1, and a gate electrode of the first transistor T1 is electrically connected to the intermediate output terminal GOUT; and a first electrode of the second transistor T2 is electrically connected to the first power terminal VGH to receive the first power signal VH, a second electrode of the second transistor T2 is electrically connected to the output terminal EOUT, and a gate electrode of the second transistor T2 is electrically connected to the intermediate output terminal GOUT.

For example, the second output sub-circuit 402 comprises a third transistor T3 and a fourth transistor T4, a first electrode of the third transistor T3 is electrically connected to the first node N1, a second electrode of the third transistor T3 is electrically connected to the third power terminal VGL1 to receive the third power signal VL1, and a gate electrode of the third transistor T3 is electrically connected to the third clock signal terminal CK1 to receive the third clock signal $V_{c3}$; and a first electrode of the fourth transistor T4 is electrically connected to the output terminal EOUT, a second electrode of the fourth transistor T4 is electrically connected to the second power terminal VGL to receive the second power signal VL, and a gate electrode of the fourth transistor T4 is electrically connected to the first node N1.

For example, in the output circuit 400, because the third power signal VL1 provided by the third power terminal VGL1 is smaller than the second power signal VL, the third power signal VL1 can control the conduction degree of the fourth transistor T4 (for example, the fourth transistor T4 can be completely turned on), in a case where the fourth transistor T4 outputs the second power signal VL with a low level to the output terminal EOUT, the second power signal VL has no threshold loss, that is, the output signal EOUT has no threshold loss, thereby achieving that the P-type transistor outputs a low-level signal without threshold loss, and improving the display quality of the display panel.

It should be noted that, the output circuit 400 as shown in FIG. 2 is merely an exemplary implementation, and the output circuit 400 provided by the embodiment of the present disclosure comprises, but is not limited to, the output circuit 400 as shown in FIG. 2.

For example, a relationship between the second power signal VL and the third power signal VL1 is expressed as:

$$VL-VL1>|Vth10+Vth12|,$$

where Vth10 represents a threshold voltage of the third transistor T3, and Vth12 represents a threshold voltage of the fourth transistor T4. For example, in a case where the third clock signal $V_{c3}$ is at a low level, a low level of the third clock signal $V_{c3}$ is equal to, for example, a level of the third power signal VL1, that is, a voltage of the gate electrode of the third transistor T3 is the third power signal VL1, and thus, in a case where a voltage of the source electrode of the third transistor T3 is lower than VL1−Vth10, the third transistor T3 is turned off, namely, a minimum voltage of the source electrode of the third transistor T3 can be VL1−Vth10. That is, in a case where the third transistor T3 is turned on, the third power signal VL1 is transmitted to the first node N1 (that is, the gate electrode of the fourth transistor T4), because the third transistor T3 has the transmission threshold loss, and the third power signal VL1 is a low-level signal, in a case where the voltage of the first node N1 is VL1−Vth10 (in this case, a gate-source voltage of the third transistor T3 is Vth10), the third transistor T3 is turned off, and cannot not continuously transmit the low-level signal. Therefore, a voltage transmitted by the third transistor T3 to the gate electrode of the fourth transistor T4 is VL1−Vth10. The voltage (VL1−Vth10) can control the fourth transistor T4 to be turned on, so that the second power signal VL is transmitted to the output terminal EOUT via the fourth transistor T4. Because the voltage of the gate electrode of the fourth transistor T4 is VL1−Vth10, in a case where a voltage of the source electrode of the fourth transistor T4 is lower than VL1−Vth10−Vth12, the fourth transistor T4 is turned off, so that a minimum value of the voltage of the source electrode of the fourth transistor T4 can be VL1−Vth10−Vth12, that is, in a case where the output signal $V_{EOUT}$ of the output terminal EOUT is VL1−Vth10−Vth12 (because both Vth10 and Vth12 are smaller than zero, that is, VL1−Vth10−Vth12=VL1+|Vth10+Vth12|), the fourth transistor T4 is turned off. In a case where the second power signal VL is completely transmitted to the output terminal EOUT, that is, the output signal $V_{EOUT}$ is the second power signal VL, a gate-source voltage Vgs12 of the fourth transistor T4 is VL1−Vth10−VL, because VL−VL1>|Vth10+Vth12|, namely VL1−Vth10−VL>Vth12, that is, the gate-source voltage Vgs12 is smaller than the threshold voltage Vth12 of the fourth transistor T4, and therefore, in a case where the output signal $V_{EOUT}$ is the second power signal VL, the fourth transistor T4 is still in a turn-on state, so that the second power signal VL can be transmitted to the output terminal EOUT without loss.

For example, in a specific example, if the threshold voltage Vth10 of the third transistor T3 is −0.5V, the threshold voltage Vth12 of the fourth transistor T4 is −0.5V, the second power signal VL is −4V, and the third power signal VL1 is −6V. The third transistor T3 is turned on, and the third power signal VL1 is transmitted to the first node N1, due to the transmission threshold loss of the third transistor T3, a minimum voltage of the first node N1 may be −5.5V (that is, −6V−(−0.5)=−5.5V), that is, in a case where the voltage of the first node N1 is −5.5V, the third transistor T3 is turned off, the third power signal VL1 cannot be completely transmitted to the first node N1. The voltage of the gate electrode of the fourth transistor T4 is −5.5V, and therefore, the minimum value of the voltage of the source electrode of the fourth transistor T4 can be −5V (that is, −5.5V−(−0.5)=−5V). In this case, the fourth transistor T4 is turned on, the second power signal VL is transmitted to the output terminal EOUT via the fourth transistor T4, because the minimum value of the voltage of the source electrode of the fourth transistor T4 is −5V, and thus, in a case where the output signal $V_{EOUT}$ is −4V (that is, the second power signal VL is −4V), the fourth transistor T4 is still in a turn-on state, that is, the second power signal VL can be transmitted to the output terminal EOUT without loss.

In summary, the shift register provided by the present disclosure can output the low-level second power signal VL to the output terminal EOUT without threshold loss.

For example, as shown in FIG. 2, the first storage circuit 403 comprises a first capacitor C1. A first terminal of the first capacitor C1 is electrically connected to the first node N1, and a second terminal of the first capacitor C1 is electrically connected to the output terminal EOUT.

For example, the intermediate circuit 200 is configured to: in the input phase, write the second clock signal $V_{c2}$ to the intermediate output terminal GOUT as the intermediate output signal $V_{GOUT}$ under control of the input voltage $V_{in}$; in the output phase and the buffer phase, write the second clock signal $V_{c2}$ to the intermediate output terminal GOUT as the intermediate output signal $V_{GOUT}$; and in the stabilization phase, write the first power signal VH to the intermediate output terminal GOUT as the intermediate output signal $V_{GOUT}$ under control of the control circuit 300. For example, the intermediate output signal $V_{GOUT}$ can be used to control, for example, the first output sub-circuit 401 in the output circuit 200 to be turned on or off.

For example, as shown in FIG. 1, the intermediate circuit 200 may comprise a first control sub-circuit 201, a second control sub-circuit 202, an intermediate output sub-circuit 203, a second storage sub-circuit 204, an intermediate output control sub-circuit 205, and a third storage sub-circuit 206. For example, in the embodiment of the present disclosure, a pull-down control sub-circuit is an example of the first control sub-circuit 201, a pull-up control sub-circuit is an example of the second control sub-circuit 202, an intermediate output pull-up sub-circuit is an example of the intermediate output control sub-circuit 205, hereinafter, the present disclosure is described by taking a case that the first control sub-circuit 201 is the pull-down control sub-circuit, the second control sub-circuit 202 is the pull-up control sub-circuit, and the intermediate output control sub-circuit 205 is the intermediate output pull-up sub-circuit as an example, however the embodiments of the present disclosure are not limited thereto, the following embodiments are the same as those described herein, and the similar portions are not described again.

For example, as shown in FIG. 1, the pull-down control sub-circuit 201 is electrically connected to a second node N2, a third node N3, a fourth node N4, the first power terminal VGH, the second power terminal VGL, and the second clock signal terminal CB, respectively. The pull-down control sub-circuit 201 is configured to control a voltage of the second node N2, in a case where the voltage of the second node N2 can control the intermediate output sub-circuit 203 to be turned on, the intermediate output sub-circuit 203 can write the second clock signal $V_{c2}$ to the intermediate output terminal GOUT as the intermediate output signal $V_{GOUT}$. For example, the pull-down control sub-circuit 201 is configured to: in the input phase, write the input voltage Vin to the second node N2; and in the stabilization phase, write the first power signal VH to the second node N2.

For example, as shown in FIG. 1, the pull-up control sub-circuit 202 is electrically connected to the third node N3, the fourth node N4, and the first clock signal terminal CK, respectively. The pull-up control sub-circuit 202 is configured to control a voltage of the third node N3, in a case where the voltage of the third node N3 can control the intermediate output pull-up sub-circuit 205 to be turned on, the intermediate output pull-up sub-circuit 205 can write the first power signal VH to the intermediate output terminal GOUT, thereby controlling (such as, pulling up) the potential of the intermediate output terminal GOUT. For example, the pull-up control sub-circuit 202 is configured to write the first clock signal $V_{c1}$ to the third node N3.

For example, as shown in FIG. 1, the intermediate output sub-circuit 203 is electrically connected to the second node N2, the intermediate output terminal GOUT, and the second clock signal terminal CB, respectively. The intermediate output sub-circuit 203 is configured to: in the input phase, the output phase, and the buffer phase, write the second clock signal $V_{c2}$ to the intermediate output terminal GOUT as the intermediate output signal V GOUT.

For example, as shown in FIG. 1, the second storage sub-circuit 204 is electrically connected to the second node N2 and the intermediate output terminal GOUT, respectively. The second storage sub-circuit 204 is configured to maintain the voltage at the second node N2.

For example, as shown in FIG. 1, the intermediate output pull-up sub-circuit 205 is electrically connected to the third node N3, the intermediate output terminal GOUT, and the first power terminal VGH, respectively. The intermediate output pull-up sub-circuit 205 is configured to: in the stabilization phase, write the first power signal VH to the intermediate output terminal GOUT under control of the control circuit 300. The third storage sub-circuit 206 is electrically connected to the third node N3 and the first power terminal VGH, respectively. For example, the intermediate output pull-up sub-circuit 205 is configured to control a potential of the intermediate output terminal GOUT, for example, to pull the potential of the intermediate output terminal GOUT up to high; and the third storage sub-circuit 206 is configured to maintain the voltage at the third node N3.

For example, as shown in FIG. 2, the pull-down control sub-circuit 201 comprises a fifth transistor T5, a sixth transistor T6, and a seventh transistor T7. A first electrode of the fifth transistor T5 is electrically connected to the first power terminal VGH to receive the first power signal VH, a second electrode of the fifth transistor T5 is electrically connected to a first electrode of the sixth transistor T6, and a gate electrode of the fifth transistor T5 is electrically connected to the third node N3; a second electrode of the sixth transistor T6 is electrically connected to the fourth node N4, and a gate electrode of the sixth transistor T6 is electrically connected to the second clock signal terminal CB to receive the second clock signal $V_{c2}$; and a first electrode of the seventh transistor T7 is electrically connected to the fourth node N4, a second electrode of the seventh transistor T7 is electrically connected to the second node N2, and a gate electrode of the seventh transistor T7 is electrically connected to the second power terminal VGL to receive the second power signal VL.

For example, as shown in FIG. 2, the pull-up control sub-circuit 202 comprises an eighth transistor T8. A first electrode of the eighth transistor T8 is electrically connected to the third node N3, a second electrode of the eighth transistor T8 is electrically connected to the first clock signal terminal CK to receive the first clock signal Vii, and a gate electrode of the eighth transistor T8 is electrically connected to the fourth node N4.

For example, as shown in FIG. 2, the intermediate output sub-circuit 203 comprises a ninth transistor T9, and the second storage sub-circuit 204 comprises a second capacitor C2. A first electrode of the ninth transistor T9 is electrically connected to the second clock signal terminal CB to receive the second clock signal $V_{c2}$, a second electrode of the ninth transistor T9 is electrically connected to the intermediate output terminal GOUT, and a gate electrode of the ninth transistor T9 is electrically connected to the second node N2. A first terminal of the second capacitor C2 is electrically connected to the second node N2, and a second terminal of the second capacitor C2 is electrically connected to the intermediate output terminal GOUT.

For example, as shown in FIG. 2, the intermediate output pull-up sub-circuit 205 comprises a tenth transistor T10, and the third storage sub-circuit comprises 206 a third capacitor C3. A first electrode of the tenth transistor T10 is electrically connected to the first power terminal VGH, a second electrode of the tenth transistor T10 is electrically connected to the intermediate output terminal GOUT, and a gate electrode of the tenth transistor T10 is electrically connected to the third node N3; and a first terminal of the third capacitor C3 is electrically connected to the third node N3, and a second terminal of the third capacitor C3 is electrically connected to the first power terminal VGH to receive the first power signal VH.

For example, the control circuit 300 is configured to: in the stabilization phase, control the intermediate output pull-up sub-circuit 205 to stabilize the voltage of the intermediate output terminal GOUT at the first power signal VH. As shown in FIG. 2, the control circuit 300 comprises an eleventh transistor T11. A first electrode of the eleventh transistor T11 is electrically connected to the second power terminal VGL to receive the second power signal VL, a second electrode of the eleventh transistor T11 is electrically connected to the third node N3, and a gate electrode of the eleventh transistor T11 is electrically connected to the first clock signal terminal CK to receive the first clock signal $V_{c1}$.

For example, the input circuit 100 is configured to transmit the input voltage Vin to the intermediate circuit 200 to trigger the shift register to operate. As shown in FIG. 2, the input circuit 100 comprises a twelfth transistor T12. A first electrode of the twelfth transistor T12 is electrically connected to the input voltage terminal STV, a second electrode of the twelfth transistor T12 is electrically connected to the fourth node N4, and a gate electrode of the twelfth transistor T12 is electrically connected to the first clock signal terminal CK to receive the first clock signal $V_{c1}$.

It should be noted that, the input circuit 100, the intermediate circuit 200, the control circuit 300 as shown in FIG. 2 are merely an example of the embodiment of the present disclosure, and the embodiment of the present disclosure comprises, but is not limited to, the case as shown in FIG. 2.

For example, a high level of the first clock signal $V_{c1}$ is identical to a level of the first power signal VH, and a low level of the first clock signal $V_{c1}$ is identical to a level of the second power signal VL.

For example, because the first power signal VH and a high-level signal of the second clock signal $V_{c2}$ are simultaneously transmitted to the intermediate output terminal GOUT in the input phase, the high level of the second clock signal $V_{c2}$ is the same as the level of the first power signal VH to prevent a voltage signal of the intermediate output terminal GOUT from conflicting at the same time. The low level of the second clock signal $V_{c2}$ is the same as the level of the second power signal VL.

For example, a high level of the third clock signal $V_{c3}$ output by the third clock signal terminal CK1 is identical to a level of the first power signal VH. The low level of the third clock signal $V_{c3}$ output by the third clock signal terminal CK1 is the same as the level of the third power signal VL1 to ensure that the fourth transistor T4 can be fully turned on, thereby outputting the second power signal VL without threshold loss.

It should be noted that, the high level of the first clock signal $V_{c1}$ and the high level of the third clock signal $V_{c3}$ may also be different from the level of the first power signal VH, the low level of the first clock signal $V_{c1}$ may also be different from the level of the second power signal VL, and the low level of the third clock signal $V_{c3}$ may also be different from the level of the third power signal VL1, as long as the first clock signal $V_{c1}$ and the third clock signal $V_{c3}$ can perform their own functions, and the present disclosure do not limit this case. In addition, the low level of the second clock signal $V_{c2}$ may also be different from the level of the second power signal VL. In the embodiment of the present disclosure, the shift register provided by the present disclosure is described by taking a case that the high level of the first clock signal $V_{c1}$ and the high level of the third clock signal $V_{c3}$ are the same as the level of the first power signal VH, and the low level of the first clock signal $V_{c1}$ is the same as the level of the second power signal VL, the low level of the third clock signal $V_{c3}$ is the same as the level of the third power signal VL1, and the low level of the second clock signal $V_{c2}$ is the same as the level of the second power signal VL as an example.

Figure 3:
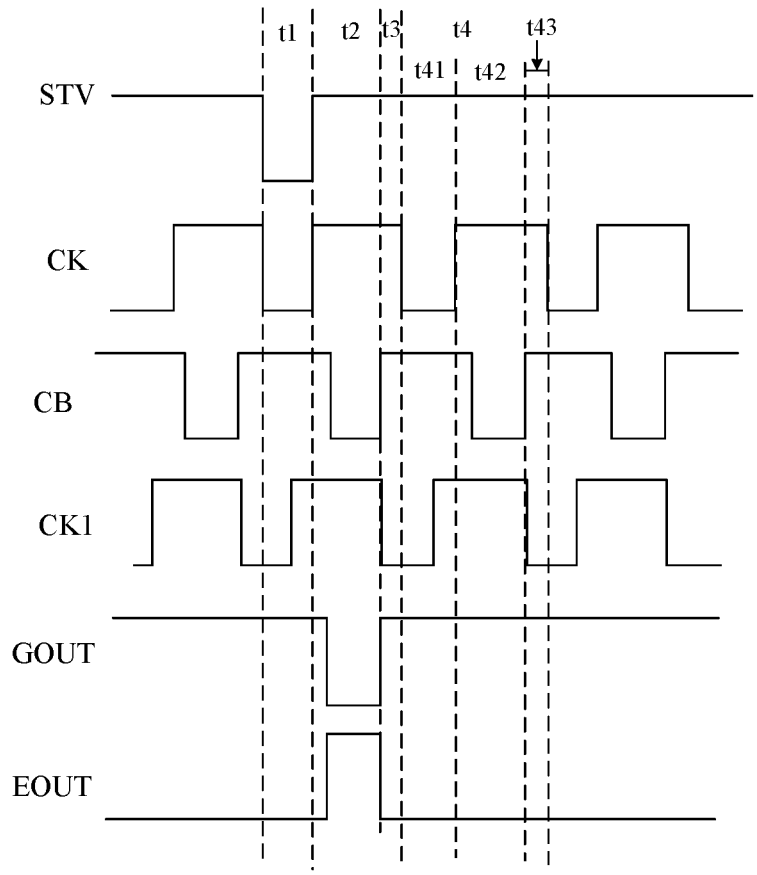
FIG. 3 is a driving timing diagram of a shift register provided by some embodiments of the present disclosure.

FIG. 3 is a driving timing diagram of a shift register provided by some embodiments of the present disclosure. Next, a working principle of the shift register provided by the embodiments of the present disclosure will be described by taking the shift register as shown in FIG. 2 and the driving timing as shown in FIG. 3 as an example.

For example, as shown in FIG. 3, a working process of the shift register provided by the embodiments of the present disclosure comprises an input phase t1, an output phase t2, a buffer phase t3, and a stabilization phase t4.

For example, as shown in FIG. 2 and FIG. 3, in the input phase t1, the first clock signal $V_{c1}$ output by the first clock signal terminal CK is a low-level signal, the second clock signal $V_{c2}$ output by the second clock signal terminal CB is a high-level signal, the third clock signal $V_{c3}$ output by the third clock signal terminal CK1 is a low-level signal, the input voltage $V_{in}$ output from the input voltage terminal STV is a low level voltage, for example, the input voltage Vin is equal to the second power signal VL. Because the first clock signal $V_{c1}$ is a low level voltage, the twelfth transistor T12 is turned on, the input voltage Vin is transmitted to the fourth node N4 via the twelfth transistor T12, because the twelfth transistor T12 transmits the low-level signal with a threshold loss, the voltage of the fourth node N4 is Vin−Vth1, that is, VL−Vth1, where Vth1 represents a threshold voltage of the twelfth transistor T12. Because the gate electrode of the seventh transistor T7 receives the second power signal VL, so that the seventh transistor T7 is in a turn-on state, and therefore, the voltage VL−Vth1 is transmitted to the second node N2 via the seventh transistor T7, for example, a threshold voltage of the seventh transistor T7 is represented as Vth8, similarly, because the seventh transistor T7 transmits a low-level signal with a threshold loss, the voltage of the second node N2 is VL−VthN2, where VthN2 is the smaller one of Vth1 and Vth8. The voltage of the second node N2 can control the ninth transistor T9 to be turned on, and the second clock signal $V_{c2}$ is written to the intermediate output terminal GOUT via the ninth transistor T9 as the intermediate output signal $V_{GOUT}$, that is, in the input phase t1, the intermediate output signal $V_{GOUT}$ is the second clock signal $V_{c2}$ with a high level, that is, the first power signal VH, so that the first transistor T1 and the second transistor T2 are both turned off. The third clock signal $V_{c3}$ is a low level voltage, so that the third transistor T3 is turned on, and the third power signal VL1 is transmitted to the first node N1 (i.e., the gate electrode of the fourth transistor T4), because the third transistor T3 transmits the low-level signal with a threshold loss, the voltage on the first node N1 is VL1−Vth10, and the voltage VL1−Vth10 can control the fourth transistor T4 to be turned on, the second power signal VL is transmitted to the output terminal EOUT via the fourth transistor T4, in a case where the output signal $V_{EOUT}$ of the output terminal EOUT is VL1+|Vth10+Vth12|, the fourth transistor T4 is turned off, because VL−VL1>|Vth10+Vth12|, that is, in a case where the output signal $V_{EOUT}$ is the second power signal VL, the fourth transistor T4 is still in a turn-on state, so that the second power signal VL can be transmitted to the output terminal EOUT without loss, that is, in the input phase t1, the output signal $V_{EOUT}$ is the second power signal VL.

For example, in the input phase t1, because the first clock signal $V_{c1}$ is a low level voltage, the eleventh transistor T11 is turned on, the second power signal VL is transmitted to the third node N3 via the eleventh transistor T11, because the voltage of the fourth node N4 is VL−Vth1, the eighth transistor T8 is turned on, and the low-level first clock signal $V_{c1}$ is transmitted to the third node N3 via the eighth transistor T8. For example, a threshold voltage of the eighth transistor T8 is represented as Vth2, a threshold voltage of the eleventh transistor T11 is represented as Vth3, and in a case where Vth3<Vth2+Vth1, the voltage of the third node N3 is VL−Vth2−Vth1; and in a case where Vth3>Vth2+Vth1, the voltage of the third node N3 is VL−Vth3. In this case, the tenth transistor T10 and the fifth transistor T5 are both turned on. Because the second clock signal $V_{c2}$ is a high-level signal, the sixth transistor T6 is turned off.

For example, as shown in FIG. 2 and FIG. 3, in the output phase t2, the first clock signal $V_{c1}$ output by the first clock signal terminal CK and the third clock signal $V_{c3}$ output by the third clock signal terminal CK1 are both high-level signals, the second clock signal $V_{c2}$ output by the second clock signal terminal CB is a low-level signal, and the input voltage Vin output from the input voltage terminal STV is a high level voltage. The ninth transistor T9 is turned on, and the second clock signal $V_{c2}$ is written to the intermediate output terminal GOUT via the ninth transistor T9 as the intermediate output signal $V_{EOUT}$. In the input phase t1, a voltage of one terminal, of the second capacitor C2, connected to the intermediate output terminal GOUT is the first power signal VH, a voltage of one terminal, of the second capacitor C2, connected to the second node N2 is VL−VthN2, however, in the output phase t2, the voltage of one terminal, of the second capacitor C2, connected to the intermediate output terminal GOUT becomes VL, that is, a change amount of the voltage is VL−VH, due to a bootstrap effect of the second capacitor C2, the voltage of one terminal, of the second capacitor C2, connected to the second node N2 becomes 2VL−VthN2−VH, that is, the voltage of the second node N2 becomes 2VL−VthN2−VH, in this case, the seventh transistor T7 is turned off, the ninth transistor T9 can be turned on better, and the output signal $V_{EOUT}$ is the second power signal VL. The third clock signal $V_{c3}$ is a high-level signal, so that the third transistor T3 is turned off. Because the second clock signal $V_{c2}$ is a low-level signal, so that both the first transistor T1 and the second transistor T2 are turned on. The first power signal VH may be transmitted to the first node N1 via the first transistor T1, so that the fourth transistor T4 is turned off; meanwhile, the first power signal VH may also be transmitted to the output terminal EOUT via the second transistor T2 as the output signal $V_{EOUT}$, in this case, the output signal $V_{EOUT}$ is the first power signal VH.

For example, in the output phase t2, the first clock signal $V_{c1}$ is a high-level signal, so that the twelfth transistor T12 and the eleventh transistor T11 are both turned off. The voltage of the fourth node N4 is still VL−VthN2, the eighth transistor T8 is turned on, the high-level first clock signal $V_{c1}$ is transmitted to the third node N3 via the eighth transistor T8, that is, the voltage of the third node N3 is the first power signal VH, and therefore, the tenth transistor T10 and the fifth transistor T5 are both turned off. Because the second clock signal $V_{c2}$ is a low-level signal, the sixth transistor T6 is turned on.

For example, as shown in FIG. 2 and FIG. 3, in the buffer phase t3, the first clock signal $V_{c1}$ output by the first clock signal terminal CK and the second clock signal $V_{c2}$ output by the second clock signal terminal CB are both high-level signals, the third clock signal $V_{c3}$ output by the third clock signal terminal CK1 is a low-level signal, and the input voltage $V_{in}$ output from the input voltage terminal STV is a high level voltage. The ninth transistor T9 is turned on, and the second clock signal $V_{c2}$ is written to the intermediate output terminal GOUT via the ninth transistor T9 as the intermediate output signal $V_{EOUT}$. In this case, the intermediate output signal $V_{EOUT}$ is the second clock signal $V_{c2}$ with a high level, that is, the first power signal VH, and the voltage of the second node N2 becomes VL−VthN2 due to a bootstrap effect of the second capacitor C2. The intermediate output signal $V_{EOUT}$ is the first power signal VH, and both the first transistor T1 and the second transistor T2 are turned off. The third clock signal $V_{c3}$ is a low level voltage, so that the third transistor T3 is turned on, and the third power signal VL1 is transmitted to the first node N1, the voltage on the first node N1 is VL1−Vth10, the voltage VL1−Vth10 can control the fourth transistor T4 to be turned on, the second power signal VL can be transmitted to the output terminal EOUT without loss, and the output signal $V_{EOUT}$ is the second power signal VL.

For example, in the buffer phase t3, the first clock signal $V_{c1}$ is a high-level signal, so that the twelfth transistor T12 and the eleventh transistor T11 are both turned off. The voltage of the second node N2 becomes VL−VthN2, in this case, the seventh transistor T7 is turned on, and the voltage of the fourth node N4 is also VL−VthN2, the eighth transistor T8 is turned on, the high-level first clock signal $V_{c1}$ is transmitted to the third node N3 via the eighth transistor T8, that is, the voltage of the third node N3 is the first power signal VH, and thus, the tenth transistor T10 and the fifth transistor T5 are both turned off. Because the second clock signal $V_{c2}$ is a high-level signal, the sixth transistor T6 is turned off.

For example, as shown in FIG. 2 and FIG. 3, in a first sub-phase t41 of the stabilization phase t4, the first clock signal $V_{c1}$ output by the first clock signal terminal CK is a low-level signal, the second clock signal $V_{c2}$ output by the second clock signal terminal CB is a high-level signal, the third clock signal $V_{c3}$ output by the third clock signal terminal CK1 is a low-level signal, the input voltage Vin output from the input voltage terminal STV is a high level voltage, for example, the input voltage Vin is equal to the first power signal VH. Because the first clock signal $V_{c1}$ is a low-level signal, the twelfth transistor T12 is turned on, the input voltage Vin is transmitted to the fourth node N4 via the twelfth transistor T12, because the twelfth transistor T12 transmits a high-level signal without threshold loss, the voltage of the fourth node N4 is the input voltage Vin (i.e., the first power signal VH), so the eighth transistor T8 is turned off. Because the seventh transistor T7 is in a turn-on state, the voltage of the second node N2 is the same as the voltage of the fourth node N4, that is, the voltage of the second node N2 is the first power signal VH, and the ninth transistor T9 is turned off. Because the first clock signal $V_{c1}$ is a low-level signal, the eleventh transistor T11 is turned on, and the voltage of the third node N3 is VL−Vth3, the tenth transistor T10 and the fifth transistor T5 are both turned on, and the first power signal VH is transmitted to the intermediate output terminal GOUT via the tenth transistor T10, that is, the intermediate output signal $V_{GOUT}$ is the first power signal VH. Under control of the intermediate output signal $V_{GOUT}$, the first transistor T1 and the second transistor T2 are both turned off. The third transistor T3 is turned on under control of the third clock signal $V_{c3}$, and the third power signal VL1 is transmitted to the first node N1 via the third transistor T3, the voltage of the first node N1 is VL1−Vth10, the voltage VL1−Vth10 can control the fourth transistor T4 to be turned on, and the second power signal VL is transmitted to the output terminal EOUT via the fourth transistor T4, so that the output signal $V_{EOUT}$ maintains at the second power signal VL with the low level.

For example, as shown in FIG. 2 and FIG. 3, in a second sub-phase t42 of the stabilization phase t4, the first clock signal $V_{c1}$ output by the first clock signal terminal CK and the third clock signal $V_{c3}$ output by the third clock signal terminal CK1 are both high-level signals, the second clock signal $V_{c2}$ output by the second clock signal terminal CB is a low-level signal, and the input voltage Vin output from the input voltage terminal STV is a high level voltage. The voltage of the second node N2 and the voltage of the fourth node N4 both are the input voltage Vin (i.e., the first power signal VH), and the ninth transistor T9 and the eighth transistor T8 are both turned off. The first clock signal $V_{c1}$ is a high-level signal, so that the twelfth transistor T12 and the eleventh transistor T11 are both turned off, and the voltage of the third node N3 is still (VL−Vth3) due to a holding effect of the third capacitor C3, the tenth transistor T10 and the fifth transistor T5 are both turned on, the first power signal VH is transmitted to the intermediate output terminal GOUT via the tenth transistor T10, and the intermediate output signal $V_{GOUT}$ is the first power signal VH. Under control of the intermediate output signal $V_{GOUT}$, the first transistor T1 and the second transistor T2 are both turned off. Because the third clock signal $V_{c3}$ is a high-level signal, the third transistor T3 is turned off, and the voltage of the first node N1 still maintains at the voltage VL1−Vth10 due to a holding effect of the first capacitor C1, so that the second power signal VL can still be transmitted to the output terminal EOUT via the fourth transistor T4 to ensure that the output signal $V_{EOUT}$ maintains at the second power signal VL with the low level.

For example, as shown in FIG. 2 and FIG. 3, in the second sub-phase t42, because the second clock signal $V_{c2}$ is a low-level signal, the sixth transistor T6 is turned on, so that the first power signal VH is transmitted to the fourth node N4 and the second node N2 via the fifth transistor T5 and the sixth transistor T6 to maintain the voltage of the second node N2 and the voltage of the fourth node N4 at a high level.

For example, as shown in FIG. 2 and FIG. 3, in a third sub-phase t43 of the stabilization phase t4, the first clock signal $V_{c1}$ output by the first clock signal terminal CK and the second clock signal $V_{c2}$ output by the second clock signal terminal CB are both high-level signals, the third clock signal $V_{c3}$ output by the third clock signal terminal CK1 is a low-level signal, and the input voltage Vin output from the input voltage terminal STV is a high level voltage. The voltage of the second node N2 and the voltage of the fourth node N4 are the first power signal VH, and the ninth transistor T9 and the eighth transistor T8 are turned off. The first clock signal $V_{c1}$ is a high-level signal, so that the twelfth transistor T12 and the eleventh transistor T11 are both turned off, the voltage of the third node N3 is still VL−Vth3, and the tenth transistor T10 and the fifth transistor T5 are both turned on. The first power signal VH is transmitted to the intermediate output terminal GOUT via the tenth transistor T10, and the intermediate output signal $V_{GOUT}$ is the first power signal VH. Under control of the intermediate output signal $V_{GOUT}$, the first transistor T1 and the second transistor T2 are both turned off. The third transistor T3 is turned on under control of the third clock signal $V_{c3}$, and the voltage of the first node N1 is VL1−Vth10, so that the output signal $V_{EOUT}$ maintains at the second power signal VL with the low level.

In summary, in the stabilization phase t4, under control of the third clock signal $V_{c3}$, the voltage of the first node N1 is periodically pulled down, thereby ensuring that the output signal $V_{EOUT}$ maintains at the second power signal VL with the low level.

Figure 4:
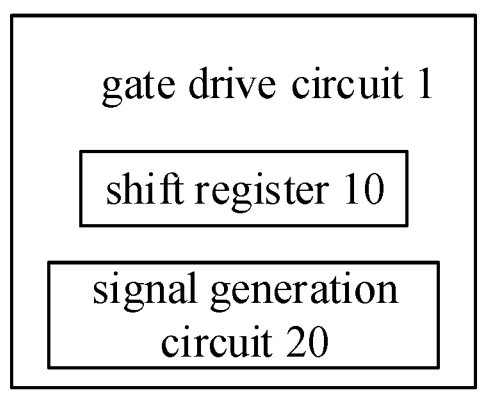
FIG. 4 is a schematic block diagram of a gate drive circuit provided by some embodiments of the present disclosure.
Figure 5:
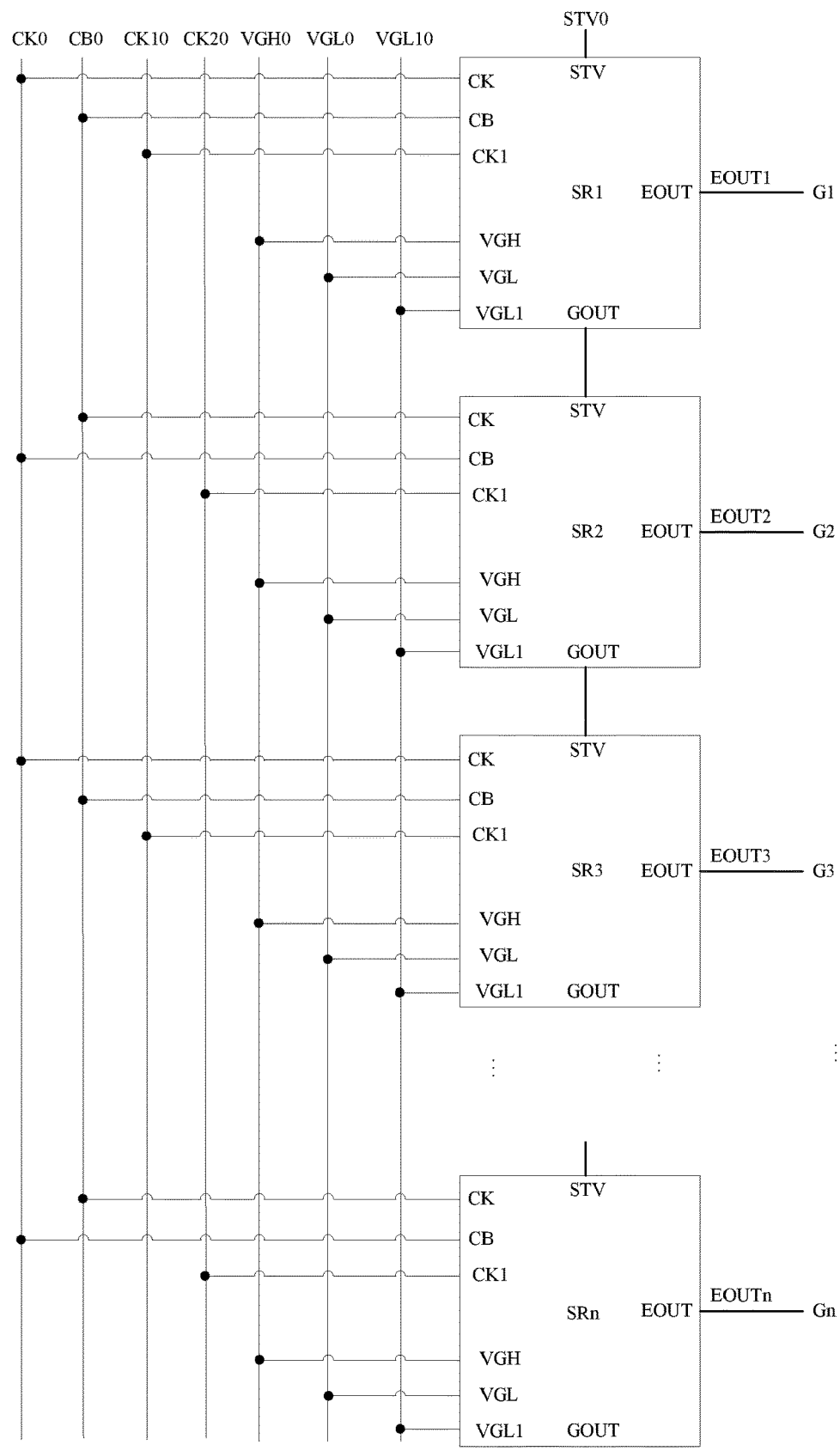
FIG. 5 is a structural schematic diagram of a gate drive circuit provided by some embodiments of the present disclosure.
Figure 6:
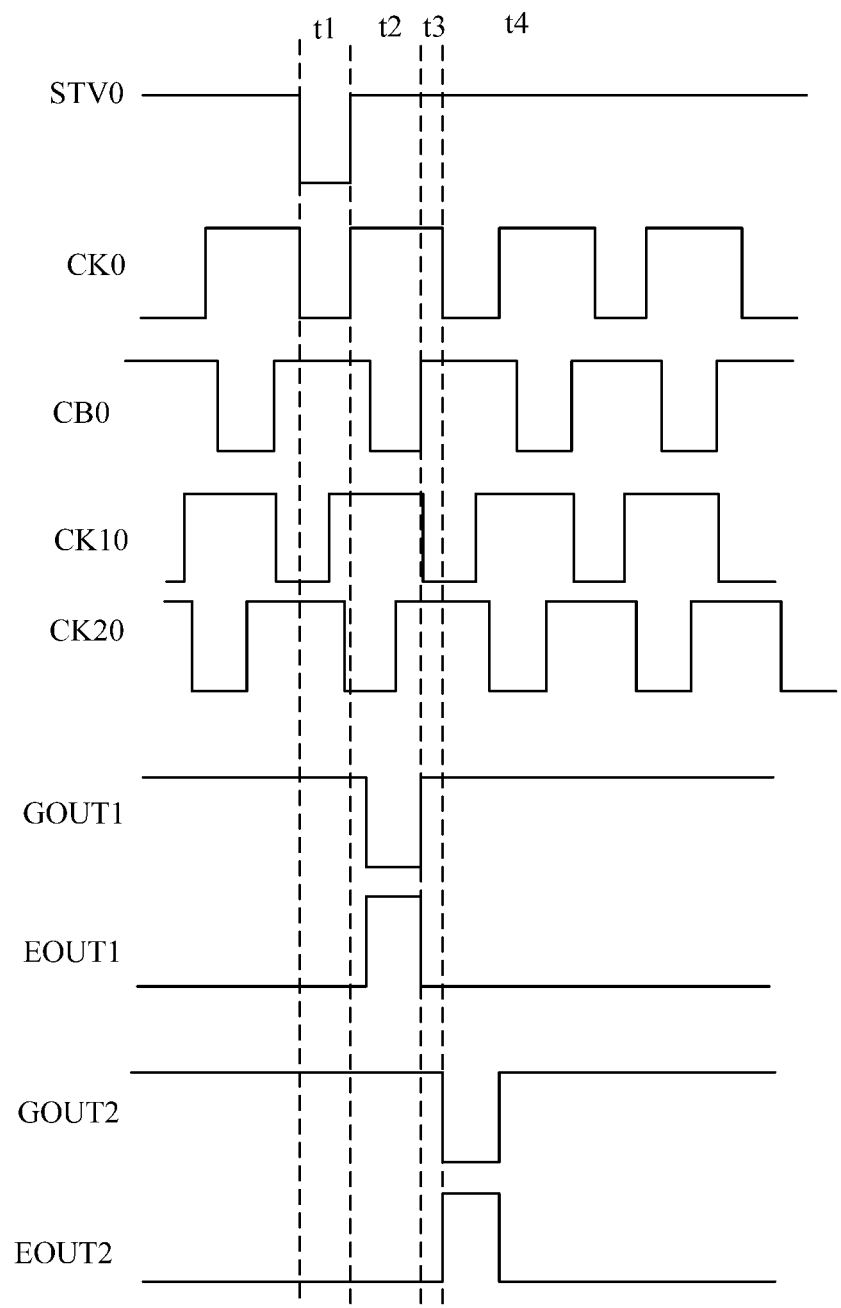
FIG. 6 is a driving timing diagram of a gate drive circuit provided by some embodiments of the present disclosure.

FIG. 4 is a schematic block diagram of a gate drive circuit provided by some embodiments of the present disclosure, FIG. 5 is a structural schematic diagram of a gate drive circuit provided by some embodiments of the present disclosure, and FIG. 6 is a driving timing diagram of a gate drive circuit provided by some embodiments of the present disclosure.

At least one embodiment of the present disclosure also provides a gate drive circuit, as shown in FIG. 4, a gate drive circuit 1 comprises the shift register 10 provided by any one of the above-described embodiments of the present disclosure. The gate drive circuit provided by the present disclosure can output a low-level signal without threshold loss through the shift register 10, thereby improving the accuracy of the outputted scan signal.

For example, as shown in FIG. 5, the gate drive circuit 1 comprises a plurality of cascaded shift registers SR1, SR2, SR3, . . . SRn (n is an integer greater than 3). For example, SR1 represents a first-stage shift register, SR2 represents a second-stage shift register, SR3 represents a third-stage shift register, and SRn represents an n-th-stage shift register. Each of these shift registers SR1, SR2, SR3, . . . , SRn may be the shift register provided by any one of the above-described embodiments of the present disclosure. Output terminals EOUT of these shift registers SR1, SR2, SR3, . . . , SRn are respectively connected, in one-to-one correspondence, with a plurality of gate lines G1, G2, G3, . . . , Gn.

Correspondingly, EOUT1 represents an output terminal of the first-stage shift register, EOUT2 represents an output terminal of the second-stage shift register, EOUT3 represents an output terminal of the third-stage shift register, and EOUTn represents an output terminal of the n-th-stage shift register.

For example, in addition to the first-stage shift register, an input voltage terminal STV of a current-stage shift register is electrically connected to an intermediate output terminal GOUT of a previous-stage shift register, thereby controlling the working state of a next-stage shift register by the intermediate output signal of a previous-stage shift register, so as to achieve to sequentially output pulse scan signals.

For example, the input voltage terminal STV of the first-stage shift register SR1 is connected with a trigger signal terminal STV0 (the trigger signal terminal STV0 is configured to provide a trigger signal to control the gate drive circuit to start operating) to receive the trigger signal as the input voltage Vin.

For example, as shown in FIG. 4, the gate drive circuit 1 also includes a signal generation circuit 20. As shown in FIG. 5, the signal generation circuit 20 is configured to generate a first control signal CK0, a second control signal CB0, a third control signal CK10, and a fourth control signal CK20. For example, for a (2N−1)-th-stage shift register (N is a positive integer, and N is greater than or equal to 1), the first control signal CK0 is the first clock signal of the shift register in the above embodiment, the second control signal CB0 is the second clock signal of the shift register in the above embodiment, and the third control signal CK10 is the third clock signal of the shift register in the above embodiment. For a 2N-th-stage shift register, the first control signal CK0 is the second clock signal of the shift register in the above embodiment, the second control signal CB0 is the first clock signal of the shift register in the above embodiment, and the fourth control signal CK20 is the third clock signal of the shift register in the above embodiment. The first control signal CK0, the second control signal CB0, the third control signal CK10, and the fourth control signal CK20 alternately control odd-numbered-stages shift registers and even-numbered-stages shift registers, thereby reducing the number of the signals and reducing production costs.

For example, as shown in FIG. 5, the first control signal CK0 is applied to a first clock signal terminal CK of the (2N−1)-th-stage shift register and a second clock signal terminal CB of the 2N-th-stage shift register; the second control signal CB0 is applied to a second clock signal terminal CB of the (2N−1)-th-stage shift register and a first clock signal terminal CK of the 2N-th stage shift register; the third control signal CK10 is applied to a third clock signal terminal CK1 of the (2N−1)-th-stage shift register; and the fourth control signal CK20 is applied to a third clock signal terminal CK1 of the 2N-th stage shift register. For example, N is a positive integer, and N is greater than or equal to 1 and is less than n/2. It should be noted that n may be an even number or an odd number, the present disclosure does not limit a value of n, and in the example as shown in FIG. 5, n is an even number.

For example, the gate drive circuit 1 further comprises a first power line VGH0, a second power line VGL0, and a third power line VGL10, to respectively provide the first power signal VH, the second power signal VL, and the third power signal VL1 to the first power terminal VGH, the second power terminal VGL, and the third power terminal VGL1 of the each-stage shift register.

It should be noted that, the above-mentioned "previous-stage" and "next-stage" do not refer to the previous-stage and the next-stage in the scan timing, but refer to the previous-stage and the next-stage in the physical connection.

For example, as shown in FIG. 6, taking the first-stage shift register SR1 and the second-stage shift register SR2 as an example, the trigger signal terminal STV0 provides a trigger signal to the first-stage shift register SR1 as an input voltage, thereby controlling the first-stage shift register SR1 to start operating, and under control of the first control signal CK0, the second control signal CB0, and the third control signal CK10, the first-stage shift register SR1 outputs a first output signal $V_{EOUT1}$ as a scan signal to the gate line G1. The intermediate output signal $V_{GOUT1}$ outputted by the first-stage shift register SR1 is transmitted to the second-stage shift register SR2 as an input voltage of the second-stage shift register SR2, thereby controlling the second-stage shift register SR2 to start operating, and under control of the first control signal CK0, the second control signal CB0, and the fourth control signal CK20, the second-stage shift register SR2 outputs a second output signal $V_{EOUT2}$ as a scan signal to the gate line G2. The intermediate output signal $V_{GOUT2}$ outputted by the second-stage shift register SR2 is transmitted to a next-stage shift register of the second-stage shift register SR2 as an input voltage of the next-stage shift register, and so on, and finally, the gate drive circuit achieves a scanning operation of one frame. For example, the specific working process of the gate drive circuit can refer to the working process of the shift register as shown in FIG. 3.

Figure 7:
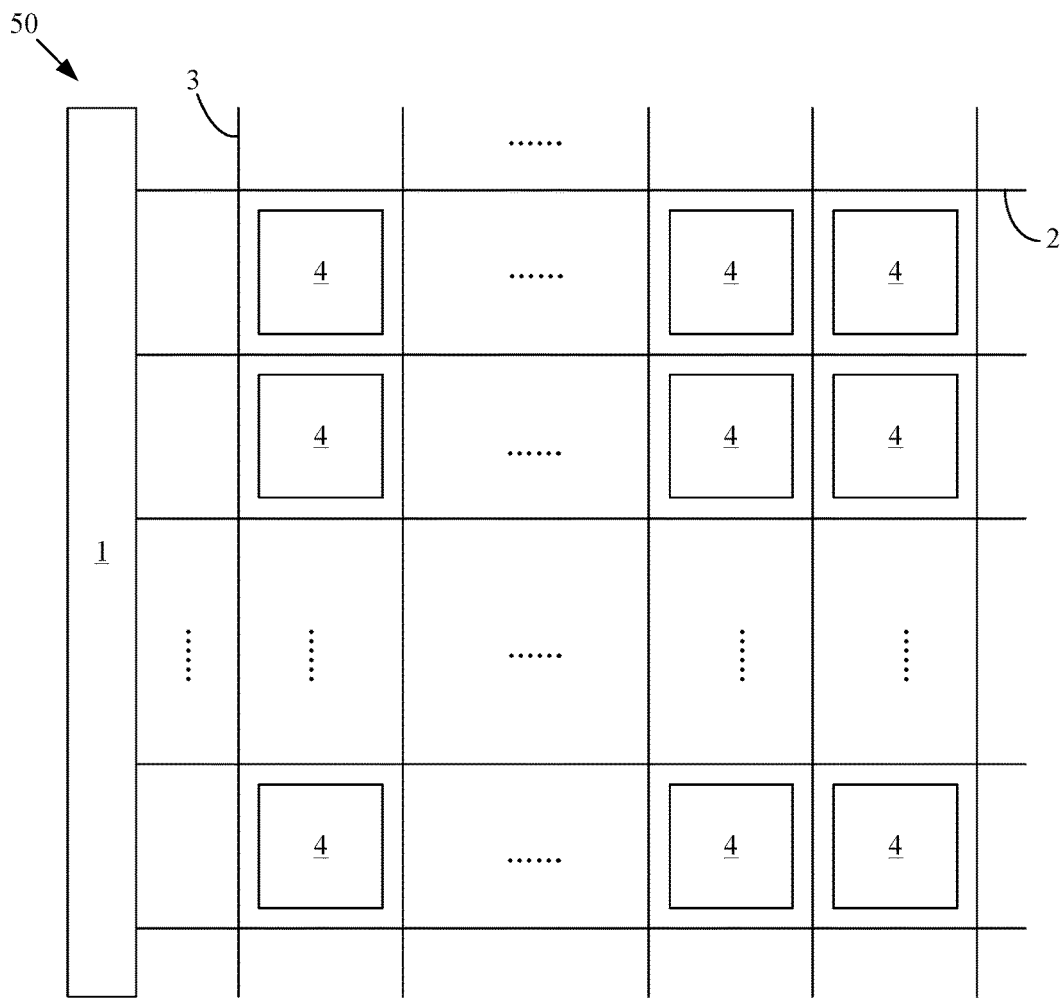
FIG. 7 is a schematic diagram of a display panel provided by some embodiments of the present disclosure.

FIG. 7 is a schematic diagram of a display panel provided by an embodiment of the present disclosure.

Some embodiments of the present disclosure also provide a display device, and the display device comprises a display panel 50 as shown in FIG. 7. As shown in FIG. 7, the display panel 50 of the display device comprises the gate drive circuit 1 provided by any one of embodiments of the present disclosure.

For example, as shown in FIG. 7, the display panel 50 provided by the embodiment of the present disclosure also comprises gate lines 2, data lines 3, and a plurality of pixel units 4 defined by the gate lines 2 and the data lines 3, and the gate drive circuit 1 is configured to provide gate driving signals to the gate lines 2. For example, the display panel 50 may also comprise a data driving circuit (not shown), and the data driving circuit is configured to provide data signals to the data lines 3. For example, under control of the gate driving signals output by the gate drive circuit 1, the data signals provided by the data driving circuit are written, row by row, into the plurality of pixel units 4 defined by crossing of the data lines 3 and the gate lines 2, to implement progressive scanning of the display panel.

For example, the gate lines 2 may comprise the gate lines G1, G2, G3, . . . , Gn as shown in FIG. 5, and each-stage shift register of the shift registers SR1, SR2, SR3, . . . , SRn is used to output a gate driving signal to a corresponding gate line of the gate lines G1, G2, G3, . . . , Gn.

For example, the display panel 50 may be applied to a mobile phone, a tablet, a television, a monitor, a notebook computer, a digital photo frame, a navigator, or any products or components having a display function.

Figure 8:
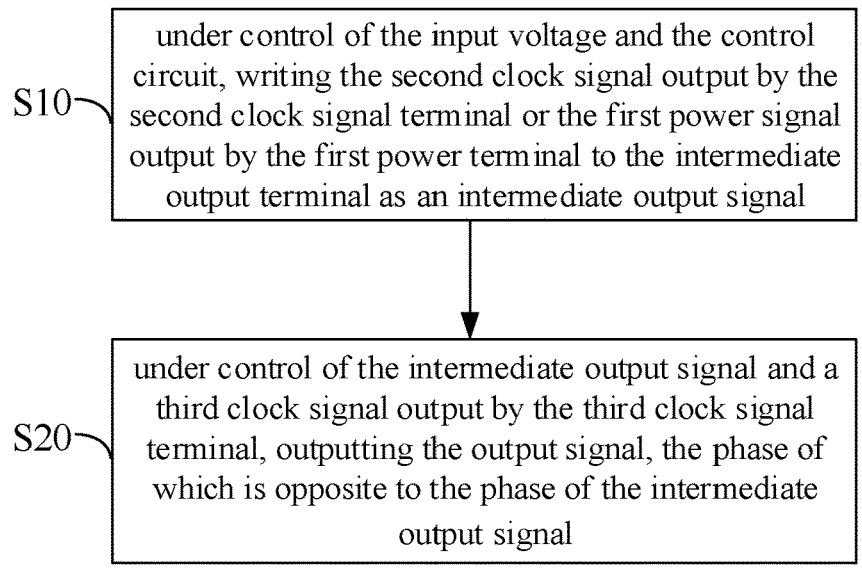
FIG. 8 is a flow chart of a driving method provided by some embodiments of the present disclosure.

FIG. 8 is a flow chart of a driving method provided by some embodiments of the present disclosure.

Some embodiments of the present disclosure also provides a driving method of a shift register according to any one of the embodiments of the present disclosure. As shown in FIG. 8, the driving method comprises the following steps:

S10: under control of the input voltage and the control circuit, writing the second clock signal output by the second clock signal terminal or the first power signal output by the first power terminal to the intermediate output terminal as an intermediate output signal; and S20: under control of the intermediate output signal and the third clock signal output by the third clock signal terminal, outputting the output signal, the phase of which is opposite to the phase of the intermediate output signal.

The driving method of the shift register provided by the embodiments of the present disclosure can achieve that a P-type thin film transistor outputs a low-level signal without threshold loss, thereby improving the display quality of the display panel.

It should be noted that the specific operation process of the driving method provided by the embodiment of the present disclosure may refer to the related descriptions of the input phase t1, the output phase t2, the buffer phase t3, and the stabilization phase t4 in the embodiment of the above shift register, and the repeated portions will not be repeated here again.

For the present disclosure, the following statements should be also noted:

(1) The accompanying drawings involve only the structure(s) in connection with the embodiment(s) of the present disclosure, and other structure(s) can refer to common design(s).

(2) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto. The protection scope of the present disclosure should be based on the protection scope of the claims.

What is claimed is:

1. A gate drive circuit, comprising a plurality of cascaded shift registers each of the plurality of cascaded shift registers, comprising: an input circuit, a control circuit, an intermediate circuit, and an output circuit, wherein the input circuit is electrically connected to an input voltage terminal and a first clock signal terminal, respectively, and is configured to input an input voltage provided by the input voltage terminal to the intermediate circuit under control of a first clock signal provided by the first clock signal terminal;

the intermediate circuit is electrically connected to an intermediate output terminal, a first power terminal, a second power terminal, the first clock signal terminal, and a second clock signal terminal, respectively, and is configured to, under control of the input voltage and the control circuit, write a second clock signal output by the second clock signal terminal or a first power signal output by the first power terminal to the intermediate output terminal as an intermediate output signal; and the output circuit is electrically connected to the first power terminal, the second power terminal, a third power terminal, a third clock signal terminal, the intermediate output terminal, and an output terminal, respectively, and is configured to output an output signal, a phase of which is opposite to a phase of the intermediate output signal, at the output terminal, wherein the output circuit comprises a first output sub-circuit, a second output sub-circuit, and a first storage circuit, the first output sub-circuit is electrically connected to the first power terminal, the intermediate output terminal, the output terminal, and a first node, respectively, and is configured to:

in an output phase, write the first power signal to the output terminal under control of the intermediate output signal;

the second output sub-circuit is electrically connected to the second power terminal, the third power terminal, the third clock signal terminal, the first node, and the output terminal, respectively, and is configured to:

in an input phase, a buffer phase, and a stabilization phase, write a second power signal provided by the second power terminal to the output terminal under control of a third clock signal output by the third clock signal terminal; and the first storage circuit is electrically connected to the first node and the output terminal, wherein the first output sub-circuit comprises a first transistor and a second transistor, a first electrode of the first transistor is electrically connected to the first power terminal, a second electrode of the first transistor is electrically connected to the first node, and a gate electrode of the first transistor is electrically connected to the intermediate output terminal; a first electrode of the second transistor is electrically connected to the first power terminal, a second electrode of the second transistor is electrically connected to the output terminal, and a gate electrode of the second transistor is electrically connected to the intermediate output terminal;

the second output sub-circuit comprises a third transistor and a fourth transistor, a first electrode of the third transistor is electrically connected to the first node, a second electrode of the third transistor is electrically connected to the third power terminal, and a gate electrode of the third transistor is electrically connected to the third clock signal terminal; a first electrode of the fourth transistor is electrically connected to the output terminal, a second electrode of the fourth transistor is electrically connected to the second power terminal, and a gate electrode of the fourth transistor is electrically connected to the first node; and the first storage circuit comprises a first capacitor, a first terminal of the first capacitor is electrically connected to the first node, and a second terminal of the first capacitor is electrically connected to the output terminal, wherein the third power terminal is configured to provide a third power signal, and the second power signal is larger than the third power signal, wherein in addition to a first-stage shift register, an input voltage terminal of a current-stage shift register is electrically connected to an intermediate output terminal of a previous-stage shift register, the gate drive circuit further comprises a signal generation circuit, wherein the signal generation circuit is configured to generate a first control signal, a second control signal, a third control signal, and a fourth control signal, the first control signal is applied to a first clock signal terminal of a (2N−1)-th-stage shift register and a second clock signal terminal of a 2N-th-stage shift register;

the second control signal is applied to a second clock signal terminal of the (2N−1)-th-stage shift register and a first clock signal terminal of the 2N-th-stage shift register;

the third control signal is applied to a third clock signal terminal of the (2N−1)-th-stage shift register; and the fourth control signal is applied to a third clock signal terminal of the 2N-th-stage shift register, wherein N is an positive integer, and N is greater than or equal to 1.

2. The gate drive circuit according to claim 1, wherein a relationship between the second power signal and the third power signal is expressed as:

$$VL-VL1>|Vth10+Vth12|,$$

where VL represents the second power signal, VL1 represents the third power signal, Vth10 represents a threshold voltage of the third transistor, and Vth12 represents a threshold voltage of the fourth transistor.

3. The gate drive circuit according to claim 1, wherein the intermediate circuit is configured to:

in the input phase, write the second clock signal to the intermediate output terminal as the intermediate output signal under control of the input voltage;

in the output phase and the buffer phase, write the second clock signal to the intermediate output terminal as the intermediate output signal; and in the stabilization phase, write the first power signal to the intermediate output terminal as the intermediate output signal under control of the control circuit.

4. The gate drive circuit according to claim 3, wherein the intermediate circuit comprises:

a first control sub-circuit, electrically connected to a second node, a third node, a fourth node, the first power terminal, the second power terminal, and the second clock signal terminal, respectively, and configured to:

in the input phase, write the input voltage to the second node; and in the stabilization phase, write the first power signal to the second node;

a second control sub-circuit, electrically connected to the third node, the fourth node, and the first clock signal terminal, respectively, and configured to write the first clock signal to the third node; and an intermediate output sub-circuit, electrically connected to the second node, the intermediate output terminal, and the second clock signal terminal, respectively, and configured to:

in the input phase, the output phase, and the buffer phase, write the second clock signal to the intermediate output terminal as the intermediate output signal.

5. The gate drive circuit according to claim 4, wherein the first control sub-circuit comprises a fifth transistor, a sixth transistor, and a seventh transistor, a first electrode of the fifth transistor is electrically connected to the first power terminal, a second electrode of the fifth transistor is electrically connected to a first electrode of the sixth transistor, and a gate electrode of the fifth transistor is electrically connected to the third node;
    a second electrode of the sixth transistor is electrically connected to the fourth node, and a gate electrode of the sixth transistor is electrically connected to the second clock signal terminal; and
    a first electrode of the seventh transistor is electrically connected to the fourth node, a second electrode of the seventh transistor is electrically connected to the second node, and a gate electrode of the seventh transistor is electrically connected to the second power terminal.

6. The gate drive circuit according to claim 4, wherein the second control sub-circuit comprises an eighth transistor, a first electrode of the eighth transistor is electrically connected to the third node, a second electrode of the eighth transistor is electrically connected to the first clock signal terminal, and a gate electrode of the eighth transistor is electrically connected to the fourth node.

7. The gate drive circuit according to claim 4, wherein the intermediate output sub-circuit comprises a ninth transistor, a first electrode of the ninth transistor is electrically connected to the second clock signal terminal, a second electrode of the ninth transistor is electrically connected to the intermediate output terminal, and a gate electrode of the ninth transistor is electrically connected to the second node.

8. The gate drive circuit according to claim 4, wherein the intermediate circuit further comprises a second storage sub-circuit, the second storage sub-circuit comprises a second capacitor, a first terminal of the second capacitor is electrically connected to the second node, and a second terminal of the second capacitor is electrically connected to the intermediate output terminal.

9. The gate drive circuit according to claim 4, wherein the intermediate circuit further comprises:
    an intermediate output control sub-circuit, electrically connected to the third node, the intermediate output terminal, and the first power terminal, respectively, and configured to: in the stabilization phase, write the first power signal to the intermediate output terminal under control of the control circuit; and
    a third storage sub-circuit, electrically connected to the third node and the first power terminal, respectively.

10. The gate drive circuit according to claim 9, wherein the intermediate output control sub-circuit comprises a tenth transistor, and the third storage sub-circuit comprises a third capacitor, a first electrode of the tenth transistor is electrically connected to the first power terminal, a second electrode of the tenth transistor is electrically connected to the intermediate output terminal, and a gate electrode of the tenth transistor is electrically connected to the third node;
    a first terminal of the third capacitor is electrically connected to the third node, and a second terminal of the third capacitor is electrically connected to the first power terminal.

11. The gate drive circuit according to claim 9, wherein a high level of the second clock signal is identical to a level of the first power signal, and a low level of the second clock signal is identical to a level of the second power signal.

12. The gate drive circuit according to claim 4, wherein the control circuit comprises an eleventh transistor, a first electrode of the eleventh transistor is electrically connected to the second power terminal, a second electrode of the eleventh transistor is electrically connected to the third node, and a gate electrode of the eleventh transistor is electrically connected to the first clock signal terminal.

13. The gate drive circuit according to claim 1, wherein a high level of a clock signal output by the third clock signal terminal is identical to a level of the first power signal, and a low level of the clock signal output by the third clock signal terminal is identical to a level of the third power signal.

14. The gate drive circuit according to claim 1, wherein the input circuit comprises a twelfth transistor, a first electrode of the twelfth transistor is electrically connected to the input voltage terminal, a second electrode of the twelfth transistor is electrically connected to a fourth node, and a gate electrode of the twelfth transistor is electrically connected to the first clock signal terminal.

15. A display device, comprising the gate drive circuit according to claim 1.

16. A driving method of the shift register according to claim 1, comprising:
    under control of the input voltage and the control circuit, writing the second clock signal output by the second clock signal terminal or the first power signal output by the first power terminal to the intermediate output terminal as the intermediate output signal; and
under control of the intermediate output signal and a third clock signal output by the third clock signal terminal, outputting the output signal, the phase of which is opposite to the phase of the intermediate output signal, at the output terminal.

* * * * *